(12) United States Patent
Kim et al.

(10) Patent No.: US 11,334,123 B2
(45) Date of Patent: May 17, 2022

(54) FOLDABLE DISPLAY DEVICE

(71) Applicants: Samsung Display Co., LTD., Yongin-si (KR); FINE DNC CO., LTD, Asan-si (KR)

(72) Inventors: Se Yong Kim, Gimpo-si (KR); Chang Soo Kim, Incheon (KR); Sung Chun Hong, Seoul (KR); Jin Yong Sim, Seongnam-si (KR)

(73) Assignees: SAMSUNG DISPLAY CO., LTD., Gyeonggi-Do (KR); FINE DNC CO., LTD., Asan-si (KR)

( * ) Notice: Subject to any disclaimer, the term of this patent is extended or adjusted under 35 U.S.C. 154(b) by 0 days.

(21) Appl. No.: 16/883,647

(22) Filed: May 26, 2020

(65) Prior Publication Data

US 2020/0383217 A1 Dec. 3, 2020

(30) Foreign Application Priority Data

Jun. 3, 2019 (KR) .................. 10-2019-0065233

(51) Int. Cl.
| | |
|---|---|
| *G06F 1/16* | (2006.01) |
| *E05D 3/12* | (2006.01) |
| *E05D 3/06* | (2006.01) |
| *E05D 3/18* | (2006.01) |
| *H01L 51/00* | (2006.01) |

(52) U.S. Cl.
CPC ............. *G06F 1/1681* (2013.01); *E05D 3/06* (2013.01); *E05D 3/122* (2013.01); *E05D 3/18* (2013.01); *E05Y 2201/48* (2013.01); *E05Y 2900/606* (2013.01); *H01L 51/0097* (2013.01); *H01L 2251/5338* (2013.01)

(58) Field of Classification Search
CPC ......... G06F 1/1681; E05D 3/12; E05D 3/122; E05D 3/06; E05D 3/18
See application file for complete search history.

(56) References Cited

U.S. PATENT DOCUMENTS

| | | | | |
|---|---|---|---|---|
| 9,047,055 | B2* | 6/2015 | Song ...................... | G06F 1/1681 |
| 9,811,119 | B2* | 11/2017 | Seo .......................... | G06F 1/1681 |
| 9,910,465 | B2* | 3/2018 | Tazbaz .................. | G06F 1/1681 |
| 10,140,018 | B2* | 11/2018 | Kim ....................... | G06F 1/1681 |
| 10,209,743 | B1* | 2/2019 | Hsu ........................ | G06F 1/1681 |
| 10,306,783 | B2* | 5/2019 | Seo ........................ | G06F 1/1681 |
| 10,834,814 | B2* | 11/2020 | Cho ....................... | G06F 1/1681 |
| 2016/0324023 | A1* | 11/2016 | Kim ....................... | G06F 1/1681 |

(Continued)

FOREIGN PATENT DOCUMENTS

| | | |
|---|---|---|
| KR | 1020150099676 A | 9/2015 |
| KR | 1020170003801 A | 1/2017 |
| KR | 1020170087000 A | 7/2017 |

(Continued)

*Primary Examiner* — Jeffrey O'Brien
(74) *Attorney, Agent, or Firm* — Cantor Colburn LLP

(57) ABSTRACT

A foldable display device according to an exemplary embodiment includes a first body and a second body, and a hinge unit which is connected between the first body and the second body. The hinge unit includes a first joint which includes a first recess, a second joint which faces the first joint, a third joint disposed at one side of the first joint, a first leaf spring disposed in the first recess, and a first fastener fixed to the third joint through the first leaf spring and the first joint.

16 Claims, 17 Drawing Sheets

(56) References Cited

U.S. PATENT DOCUMENTS

2018/0011515 A1\* 1/2018 Yoo ...................... G06F 1/1681
2020/0301480 A1\* 9/2020 Miller ................... G06F 1/1681

FOREIGN PATENT DOCUMENTS

| KR | 1020170087008 A | 7/2017 |
| KR | 1020180029590 A | 3/2018 |
| KR | 1020180030434 A | 3/2018 |
| KR | 1020180122210 A | 11/2018 |

\* cited by examiner

FOLDABLE DISPLAY DEVICE

This application claims priority to Korean Patent Application No. 10-2019-0065233 filed on Jun. 3, 2019, and all the benefits accruing therefrom under 35 U.S.C. § 119, the content of which in its entirety is herein incorporated by reference.

BACKGROUND (a) Technical Field

This disclosure relates to a foldable display device.

(b) Description of the Related Art

A display device such as an organic light emitting display, a liquid crystal display, and the like includes a display panel manufactured by forming a plurality of layers and elements on a substrate. As a substrate of the display panel, glass has been used. However, a glass substrate has a drawback that it is heavy and fragile. In addition, since the glass substrate is generally rigid, it is difficult to deform the display panel. Recently, a flexible display panel that uses a flexible substrate that is light-weight, strong against impact, and deformable, and a flexible display device including the flexible display panel have been researched and developed.

The flexible display device can be classified into a bendable display device, a foldable display device, a rollable display device, a stretchable display device, and the like, depending on usage and shape. Among them, the foldable display device can be folded and unfolded like a book.

The foldable display device can be folded and be compactly portable, and when used, it can be expanded to enjoy a wide screen.

SUMMARY

To fold a foldable display device, a hinge-like mechanical structure is required. Such a mechanical structure may be desirable to be small in size and robust, and to not damage the display panel.

Exemplary embodiments provide a foldable display device having a hinge unit of which a structure is simple and rigid. Exemplary embodiments also provide a foldable display device that can prevent damage to a display panel, and improve flatness of the display panel.

A foldable display device according to an exemplary embodiment includes a first body and a second body, and a hinge unit which is connected between the first body and the second body. The hinge unit includes a first joint which includes a first recess, a second joint which faces the first joint, a third joint disposed at one side of the first joint, a first leaf spring disposed in the first recess, and a first fastener fixed to the third joint through the first leaf spring and the first joint.

In an exemplary embodiment, an outer side of the first joint and an inner side of the third joint may face each other, the outer side of the first joint and the inner side of the third joint may be curved, and the outer side of the first joint is the one side of the first joint.

In an exemplary embodiment, the first joint may have a first opening defined in the first recess, the first fastener may include a portion disposed in the first opening, and a length of the first opening may be larger than a diameter of the portion of the first fastener disposed in the first opening.

In an exemplary embodiment, the third joint may be slidably coupled to the first joint.

In an exemplary embodiment, in an unfolded state of the foldable display device, the first joint, the second joint, and the third joint may be aligned in a first direction. The first joint, the second joint, and the third joint may respectively extend in a second direction that crosses the first direction.

In an exemplary embodiment, the third joint may include a third recess, and the first recess and the third recess may not overlap each other in the first direction.

In an exemplary embodiment, the hinge unit may further include a fourth joint disposed at one side of the second joint, a fifth joint disposed at one side of the third joint, a third leaf spring disposed in the third recess, and a third fastener fixed to the fifth joint through the third leaf spring and the third joint.

In an exemplary embodiment, an outer side of the third joint and an inner side of the fifth joint may face each other, the outer side of the third joint and the inner side of the fifth joint may be curved, and the outer side of the third joint is the one side of the third joint.

In an exemplary embodiment, the first leaf spring and the third leaf spring may not overlap in the first direction.

In an exemplary embodiment, the hinge unit may further include a first connector disposed at one side of the fifth joint, a fifth leaf spring disposed in a fifth recess of the fifth joint, and a fifth fastener fixed to the first connector through the fifth leaf spring and the fifth joint.

In an exemplary embodiment, the third leaf spring and the fifth leaf spring may not overlap in the first direction.

In an exemplary embodiment, the hinge unit may further include a first rotation controller which includes a first gear and a first arm, and a second rotation controller which includes a second gear and a second arm. Teeth of the first gear and teeth of the second gear may be engaged with each other, and the first arm may be inserted into a hole of the first connector through holes of the first joint, the third joint, and the fifth joint.

In an exemplary embodiment, the first gear and the second gear may be overlapped with the first joint and the second joint respectively in the second direction.

In an exemplary embodiment, each of the first joint and the second joint may include a spindle a head. The head is disposed at one side of the spindle and defines a hole. The hinge unit may further include a connecting member including at least two protrusions. The protrusions of the connecting members may be inserted into corresponding holes of the head of the first joint and the head of the second joint such that the first joint and the second joint may be coupled to each other.

In an exemplary embodiment, the foldable display device may further include a display panel disposed on the first body, the second body, and the hinge unit, wherein the hinge unit may support the display panel to be bendable.

In an exemplary embodiment, the foldable display device may further include a step compensation layer which is disposed between the first body, the second body, the hinge unit, and the display panel, and the step compensation layer may include a cut-out pattern or may be segmented in an area that overlaps the hinge unit.

A foldable display device according to an exemplary embodiment includes a display panel, and a hinge unit which supports the display panel to be bendable. The hinge unit includes a joint unit which includes a first joint, a second joint, a third joint, and a fourth joint. The first joint and the second joint are adjacent to each other, and the third joint and the fourth joint are adjacent to the first joint and the second joint, respectively. The hinge unit also includes a first rotation controller which includes a first gear and a first arm, and a second rotation controller which includes a second gear and a second arm. Teeth of the first gear and teeth of the second gear may be engaged with each other, the first arm may penetrate the first joint and the third joint, and the second arm may penetrate the second joint and the fourth joint.

In an exemplary embodiment, the second arm may penetrate the second joint and the fourth joint.

In an exemplary embodiment, the hinge unit may further include a first leaf spring which is disposed at an inner side of the first joint, and a fastener which penetrates the first leaf spring and the first joint and is fixed to the third joint.

In an exemplary embodiment, a length of an opening through which the fastener penetrates the first joint may be larger than a diameter of a portion of the fastener, which penetrates the opening.

According to an exemplary embodiment, a foldable display device having a simple and rigid structure can be provided. In addition, it is possible to improve the flatness of display panel and prevent damage of display panel in foldable display device. It is also possible to provide effects that are described and recognized throughout the specification.

DETAILED DESCRIPTION

Figure 1:
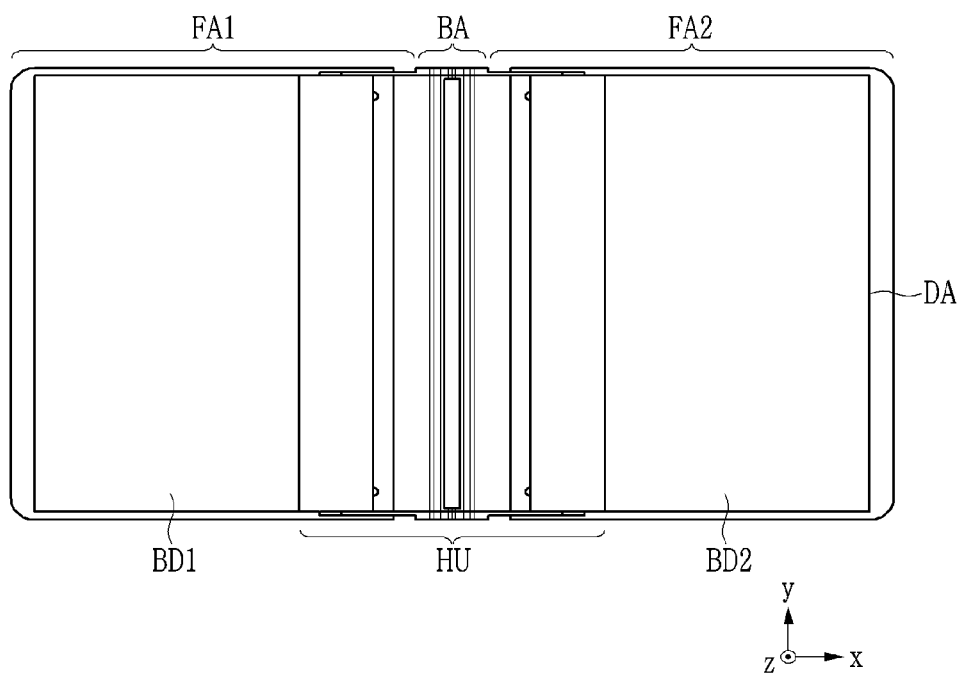
FIG. 1 is a top plan view of an exemplary embodiment of a foldable display device according to the invention.

The inventive concept will be described more fully hereinafter with reference to the accompanying drawings, in which exemplary embodiments of the inventive concept are shown. As those skilled in the art would realize, the described exemplary embodiments may be modified in various different ways, all without departing from the spirit or scope of the inventive concept.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description. In the drawings, the thickness of layers, films, panels, regions, etc., are exaggerated for clarity. In the drawings, for better understanding and ease of description, the thickness of some layers and areas is exaggerated.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

In the drawings, a symbol x indicates a first direction, y indicates a second direction that is perpendicular to the first direction x, and z indicates a third direction that is perpendicular to the first direction x and the second direction y.

Figure 2:
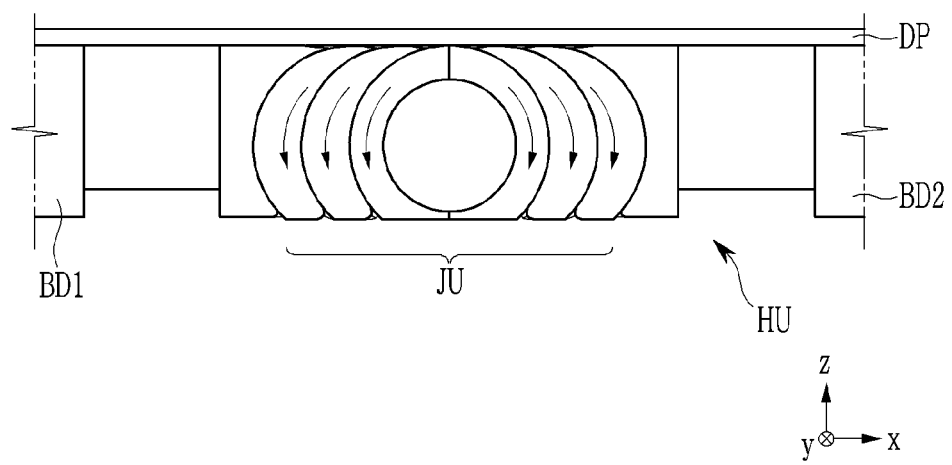
FIG. 2 is a side view of a hinge portion in a state that the foldable display device shown in FIG. 1 is unfolded.
Figure 3:
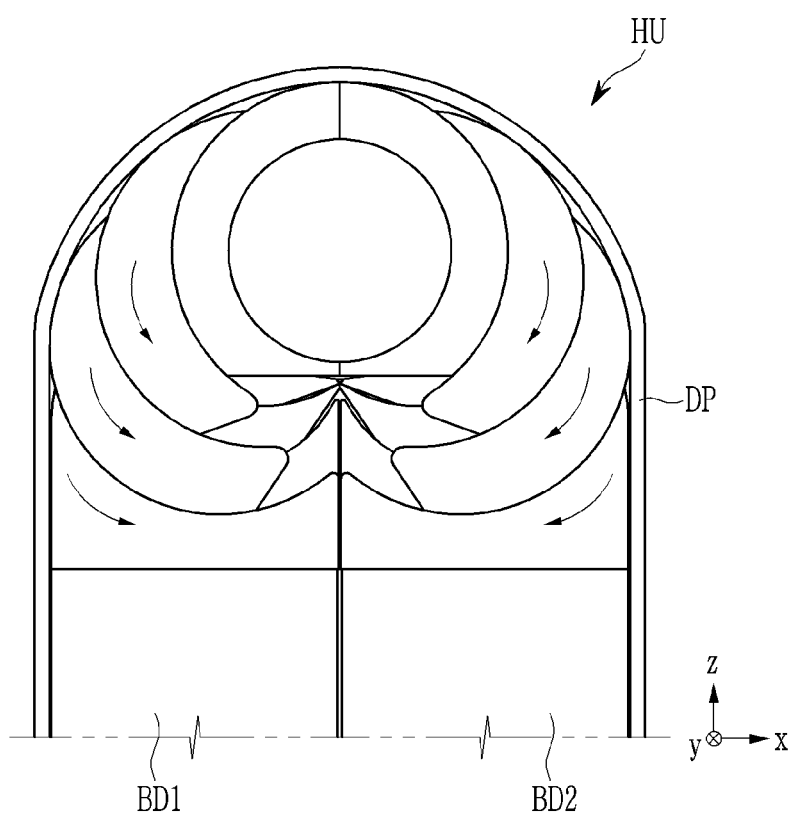
FIG. 3 is a side view of the hinge portion in a state that the foldable display device shown in FIG. 1 is folded.

FIG. 1 is a top plan view of an exemplary embodiment of a foldable display device according to the invention, FIG. 2 is a side view of a hinge unit in an unfolded state of the foldable display device shown in FIG. 1, and FIG. 3 is a side view of the hinge unit HU in a folded state of the foldable display device shown in FIG. 1.

Referring to FIG. 1, a foldable display device (hereinafter referred to as a display device) may include a bendable area BA, a first flat area FA1, and a second flat area FA2. The first flat area FA1 and the second flat area FA2 are disposed at opposite sides of the bendable area BA. The bendable area BA is an area that is bent when the display device is folded, and the first flat area FA1 and the second flat area FA2 are areas that are not substantially bent. As shown in FIG. 1, the display device may be flattened as a whole.

Although one bendable area BA is illustrated in the drawing, in another exemplary embodiment, the display device may include a plurality of bendable areas BA that are separated from each other or bent with different curvature radii. For example, the display device may include two or more bendable areas and three or more flat areas.

Referring to FIG. 1, FIG. 2, and FIG. 3, the display device includes a first body BD1, a second body BD2, and a hinge unit HU disposed between the first body BD1 and the second body BD2. The hinge unit HU is connected with the first body BD1 and the second body BD2. The hinge unit HU connects the first body BD1 and the second body BD2 to be foldable. The hinge unit HU includes a joint unit JU including a plurality of joints. The display device may be folded such that the first body BD1 and the second body BD2 may face each other by sliding rotation of the joint unit JU.

The display device includes a display panel DP that is disposed on the first and second bodies BD1 and BD2 and the hinge unit HU. The display panel DP may be attached to the first and second bodies BD1 and BD2. A plurality of parts, for example, a driver, a processor, a memory, a printed circuit board, a battery, a communication module, a speaker, various sensors, and the like, which form the display device, may be provided in the bodies BD1 and BD2. In FIG. 1, the display panel DP is not illustrated to clearly show the bodies BD1 and BD2 and the hinge portion HU that are disposed below the display panel DP. However, in FIG. 2 and FIG. 3, the display panel DP is schematically illustrated to show a location of the display panel DP in the display device, even though the display panel DP may not be seen when the display device is viewed from a side. The display panel DP may be disposed in the display area DA that approximately covers the first flat area FA1, the second flat area FA2, and the entire bendable area BA. The display area DA is an area that corresponds to a screen where an image is displayed.

The display panel DP is a panel where pixels that can display an image are disposed on a substrate. The display panel DP may include light emitting diodes corresponding to the pixels. The display panel DP is a flexible panel of which at least a part can be bent. An area of the display panel DP, which corresponds to at least the bendable area BA of the display device, may be flexible and bendable, or the display panel DP may be wholly flexible.

As shown in FIG. 1 and FIG. 2, the first body BD1 and the second body BD2 may support the display panel DP in the first flat area FA1 and the second flat area FA2, respectively, such that first flat area FA1 and the second flat area FA2 can be flat by the first body BD1 and the second body BD2. As shown in FIG. 2 and FIG. 3, the hinge unit HU may bendably support the display panel DP in the bendable area BA. As shown in FIG. 3, the display device may be folded such that the display panel DP is exposed to the outside (i.e., the screen is exposed to the outside), or to the inside.

An elastomer layer, which is formed of or includes a material such as thermoplastic polyurethane ("TPU"), may be disposed between the bodies BD1 and BD2, the hinge unit HU, and the display panel DP. The elastomer layer may flatten the display panel DP, and may mitigate and disperse the impact applied to the display panel DP. The arrows in FIGS. 2 and 3 illustrate moving directions of parts of joint unit JU when a state of the display device changes from the unfolded state to the folded state.

The hinge unit HU according to the exemplary embodiment will be described with reference to FIG. 4, FIG. 5, and FIG. 6.

Figure 4:
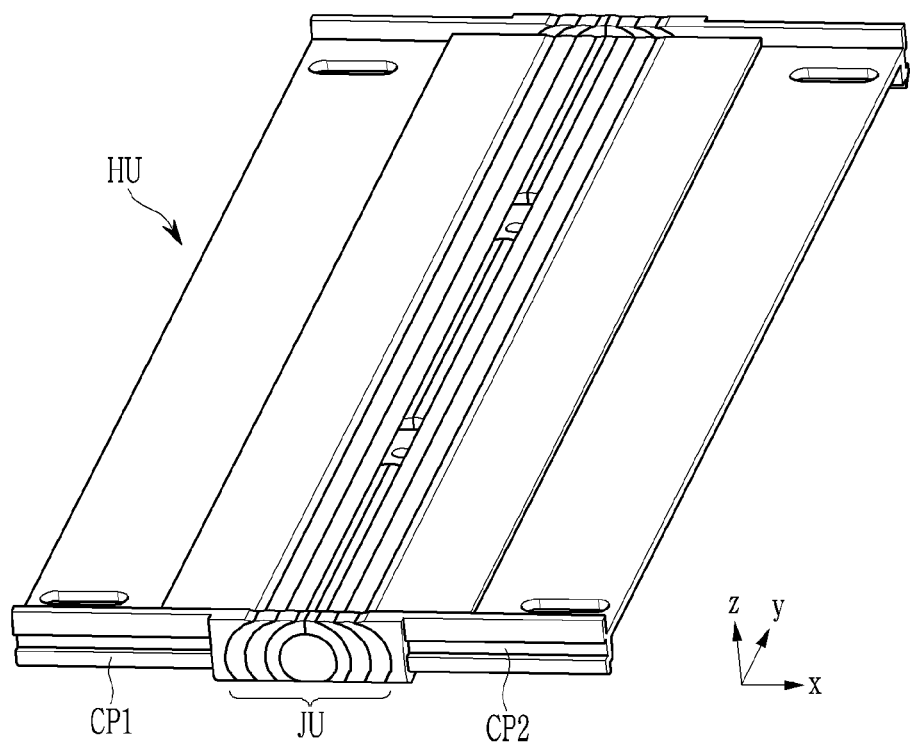
FIG. 4 is a perspective view of an exemplary embodiment of a hinge portion in an unfolded state according to the invention.
Figure 5:
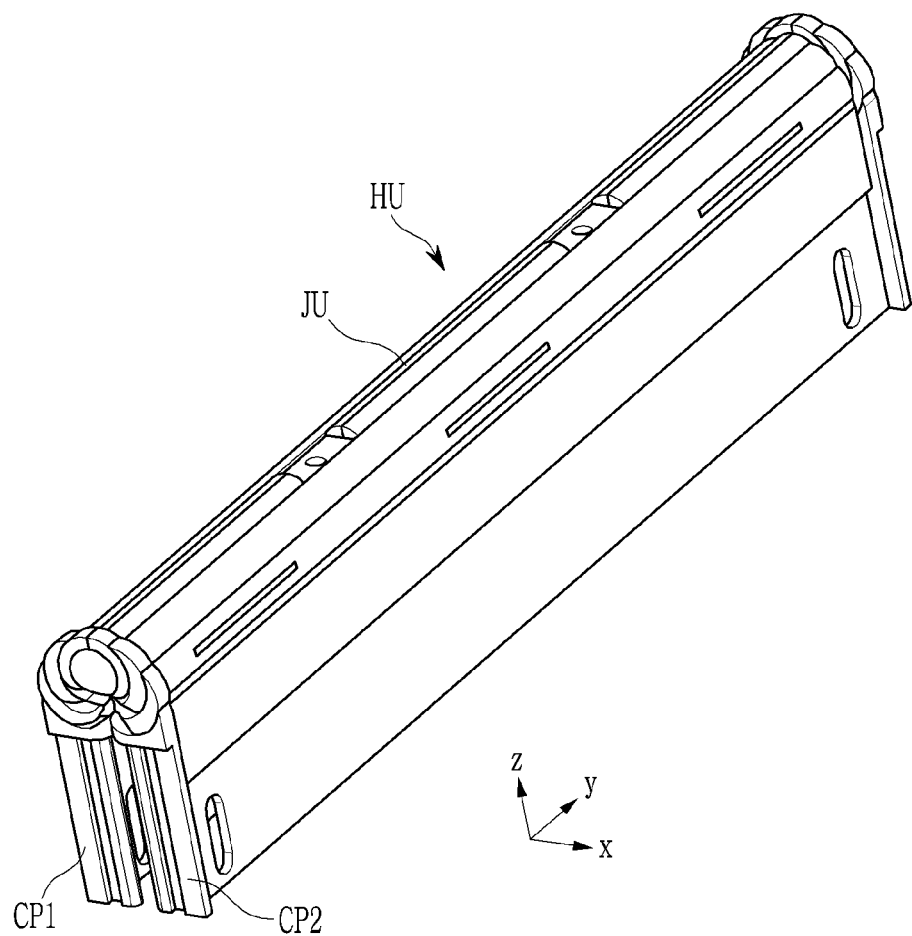
FIG. 5 is a perspective view of the hinge portion shown in FIG. 4 in a folded state.
Figure 6:
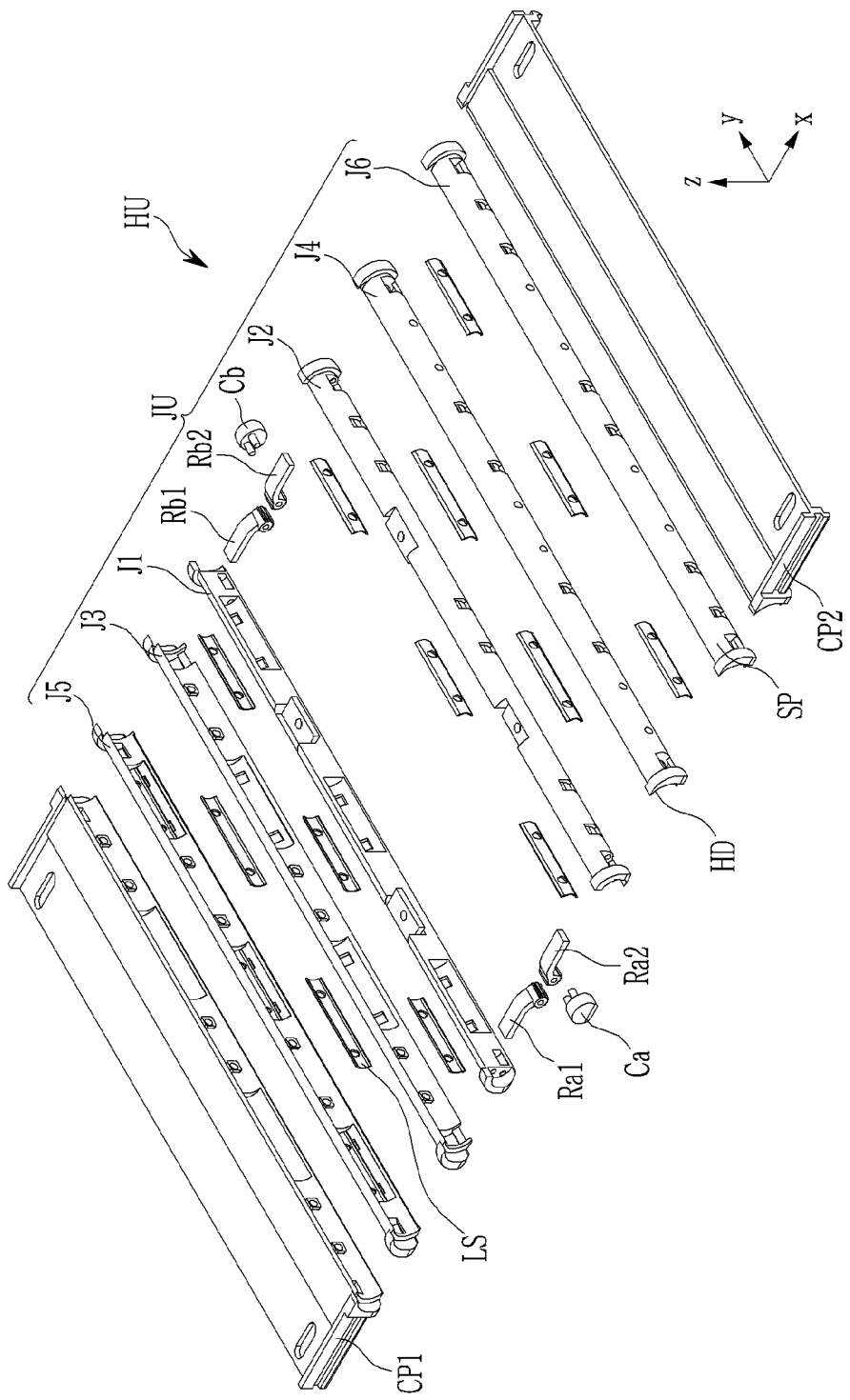
FIG. 6 is an exploded perspective view of the hinge unit of FIG. 4.

FIG. 4 is a perspective view that shows an exemplary embodiment of an unfolded state of the hinge unit according to the invention, FIG. 5 is a perspective view of a folded state of the hinge unit shown in FIG. 4, and FIG. 6 is an exploded perspective view of the hinge unit shown in FIG. 4. In FIG. 4, FIG. 5, and FIG. 6, the hinge unit HU is illustrated separately from the display device.

Referring to FIG. 4 and FIG. 5, the hinge unit HU includes a first connector CP1, a second connector CP2, and a joint unit JU disposed between the first connector CP1 and the second connector CP2. The joint unit JU is coupled with the first connector CP1 and the second connector CP2. The first connector CP1 is coupled with the first body BD1, and the second connector CP2 is coupled with the second body BD2. When the display device is in an unfolded state, a main plane of the first connector CP1 and a main plane of the second connector CP2 may be parallel with each other as shown in FIG. 4. When the display device is in a folded state, the first connector CP1 and the second connector CP2 face each other as shown in FIG. 5.

Referring to FIG. 6, the joint unit JU includes a plurality of joints J1, J2, J3, J4, J5, and J6 and a plurality of leaf springs LS. The joint unit JU may also include connecting members Ca and Cb that couple the first joint J1 and the second joint J2, respectively, and may include a plurality of rotation controllers Ra1, Rb1, Ra2, and Rb2 that control a rotation angle of the joint unit JU. The rotation controllers Ra1 and Ra2 are coupled with the connecting members Ca, and the rotation controllers Rb1 and Rb2 are coupled with the connecting members Cb.

Each of the joints J1, J2, J3, J4, J5, and J6 may have a shape that is thin and long in a second direction y. Each of the joints J1, J2, J3, J4, J5, and J6 may include a spindle portion SP and head portions HD that are disposed at opposite sides of the spindle portion SP. One or more recesses RC are defined along the second direction y and inside the spindle portion SP of each of the joints J1, J2, J3, J4, J5, and J6, and the leaf spring LS is disposed inside the recess RC. Here, an inner side of each of the joints J1, J2, J3, J4, J5, and J6 refers to a surface that faces toward a center of the joint unit JU in the unfolded state of the display device. Hereinafter, unless otherwise specified, the description of the joints J1, J2, J3, J4, J5, and J6 mainly describes the characteristics of the spindle portion SP.

In the plurality of joints J1, J2, J3, J4, J5, and J6, the first joint J1, and the second joint J2 are disposed at a center, while facing each other. Outer surfaces of the first joint J1 and the second joint J2, which oppose each other, may be curved. The first joint J1 and the second joint J2 may form a cylindrical shape together when they are coupled with each other. Opposing inner surfaces of the first joint J1 and the second joint J2 may be in close contact with each other. The head portion HD of each of the first joint J1 and the second joint J2 may define a hole, and therefore, protrusions of the connecting members Ca and Cb are inserted into the holes of the head portions HD at opposite ends of the first joint J1 and the second joint J2 such that the first joint J1 and the second joint J2 can be coupled to not be separated from each other.

The third joint J3 and the fourth joint J4 are disposed close to the first joint J1 and the second joint J2, respectively. Inner surfaces of the third and fourth joints J3 and J4, which face each other, may be curved surfaces, and Outer surfaces opposing each other may be curved surfaces. At least parts of the inner surfaces of the third joint J3 and the fourth joint J4 may be approximately coincident with or close to the outer surfaces of first joint J1 and the second joint J2, respectively. The third joint J3 and the fourth joint J4 may be slidably coupled with the first joint J1 and the second joint J2 through couplings of the leaf springs LS in the recesses RC of the first joint J1 and the second joint J2, respectively.

The fifth joint J5 and the sixth joint J6 are disposed adjacent to the third joint J3 and the fourth joint J4, respectively. Inner surfaces of the fifth joint J5 and the sixth joint J6, facing each other, may be curved surfaces, and opposing surfaces (outer surfaces) may be curved surfaces. The inner surfaces of the fifth joint J5 and the sixth joint J6 may be at least partially approximately coincident with or close to the outer surfaces of the third and fourth joints J3 and J4, respectively. The fifth joint J5 and the sixth joint J6 may be slidably coupled with the third joint J3 and the fourth joint J4 through couplings of the leaf springs LS in the recesses RC of the third joint J3 and the fourth joint J4.

The fifth joint J5 and the sixth joint J6 are coupled with the first connector CP1 and the second connector CP2, respectively. Inner surfaces of the first and second connectors CP1 and CP2, which face each other, may be curved surfaces. At least parts of the inner surfaces of the first connector CP1 and the second connector CP2 may be approximately coincident with or close to the outer surfaces of the fifth joint J5 and the sixth joint J6, respectively. The first connector CP1 and the second connector CP2 may be slidably coupled with the fifth joint J5 and the sixth joint J6 through couplings of the leaf springs LS in the recesses RC of the fifth joint J5 and the sixth joint J6, respectively.

The slidable couplings of the joints J1, J2, J3, J4, J5, and J6 of the joint unit JU and the connectors CP1 and CP2, and rotation of the hinge unit HU, will now be described with reference to FIG. 7, FIG. 8, and FIG. 9.

Figure 7:
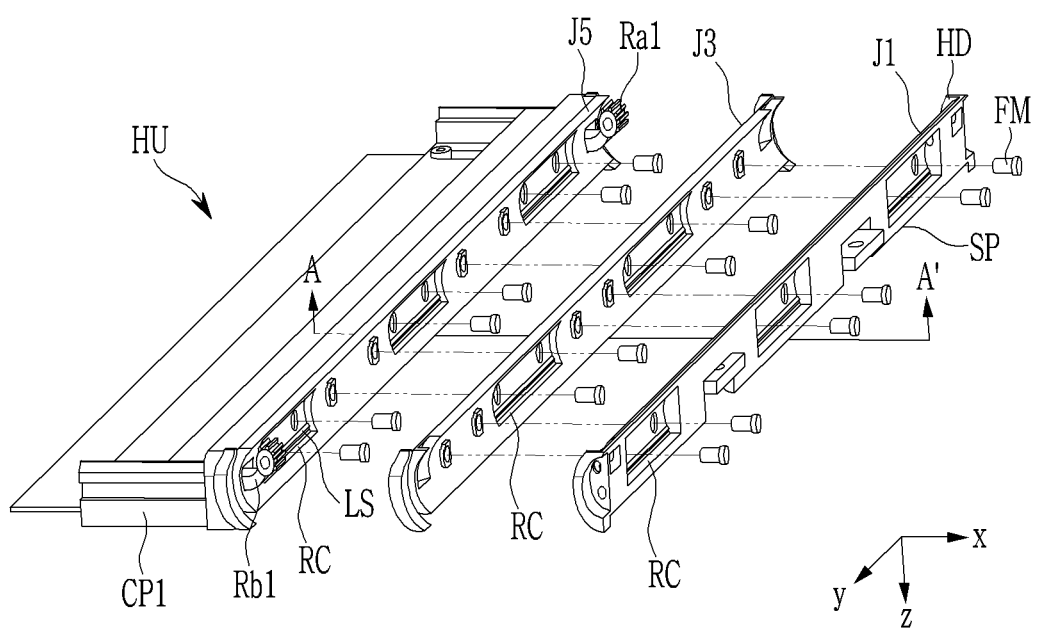
FIG. 7 is an exploded perspective view of an exemplary embodiment of a part of the hinge unit according to the invention.
Figure 8:
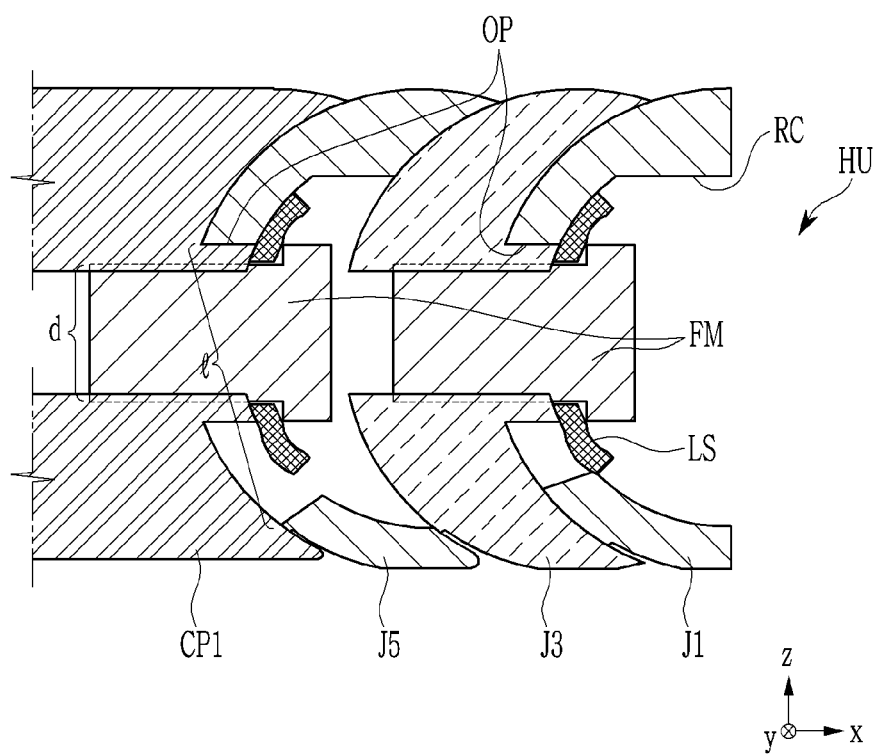
FIG. 8 is a cross-sectional view taken along line A-A' while the assembled hinge unit of FIG. 7 is being unfolded.
Figure 9:
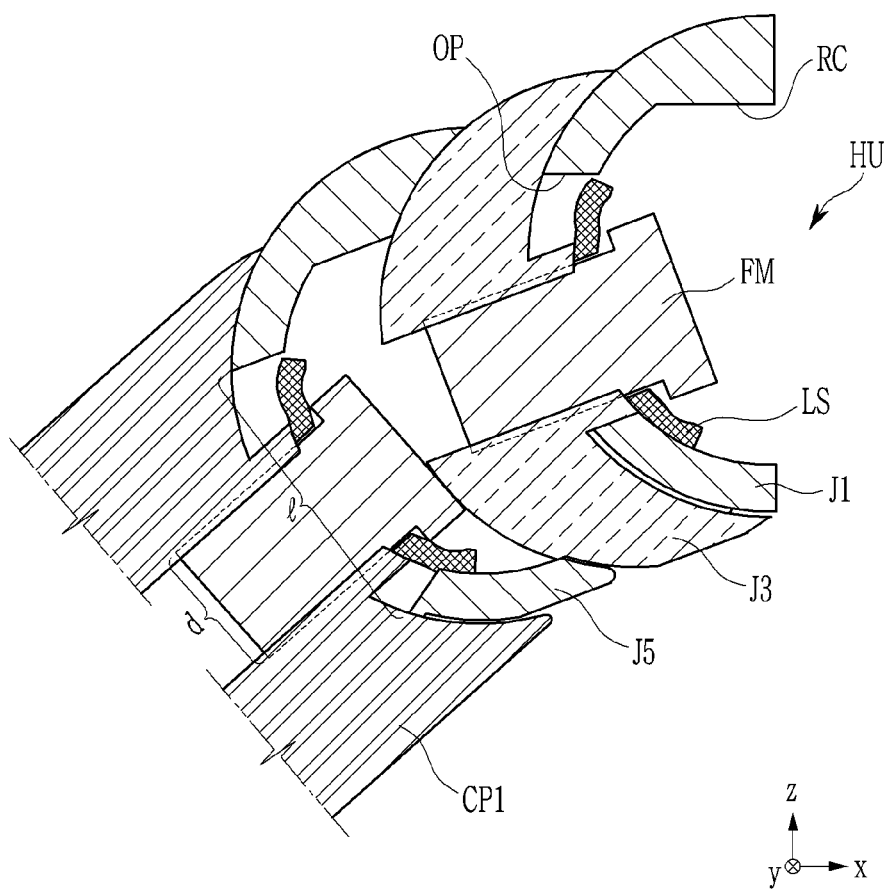
FIG. 9 is a cross-sectional view taken along line A-A' while the assembled hinge unit of FIG. 7 is partially folded.

FIG. 7 is an exploded perspective view of an exemplary embodiment of a part of the hinge unit according to the invention, FIG. 8 is a cross-sectional view taken along line A-A' while the assembled hinge unit of FIG. 7 is being unfolded, and FIG. 9 is a cross-sectional view taken along line A-A' while the assembled hinge unit of FIG. 7 is partially folded. FIG. 7, FIG. 8, and FIG. 9 show the first joint J1, the third joint J3, the fifth Joint J5, and the first connector CP1, which are located at one side with reference to the center of the hinge unit HU, and coupling relationships therebetween. The second joint J2, the fourth joint J4, the sixth joint J6, and the second connector CP2, which are located at the other side with reference to the center of the hinge unit HU, and coupling relationships therebetween, may be symmetrical to those shown in FIG. 7, FIG. 8, and FIG. 9 with respect to the center of the hinge unit HU.

Referring to FIG. 7, FIG. 8, and FIG. 9, for example, the fifth joint J5 includes three recesses RC in an inner surface thereof, and a leaf spring LS is disposed in each recess RC. The fifth joint J5 defines an opening OP formed inside the recess RC. A screw-like fastener FM is fixed to the first connector CP1 through the hole of the leaf spring LS and the opening OP of the fifth joint J5. A shank of the fastener FM penetrates the leaf spring LS and the fifth joint J5 and thus is fixed to the first connector CP1, and the head of the fastener FM may closely contact the leaf spring LS to the fifth joint J5 and the first connection part CP1. The opening OP of the fifth joint J5 may have a substantially rectangular shape, and a length Q of the opening OP in a plane perpendicular to a rotation axis (i.e., a plane formed by the first direction x and the third direction z) may be larger than a diameter d of a part (i.e., body) of the fastener FM disposed in the opening OP. Accordingly, as shown in FIG. 8 and FIG. 9, the first connector CP1 may rotate with respect to a rotation axis that is parallel with the second direction y within a range that is limited by the opening OP of the fifth joint J5. The first connector CP1 may rotate together with the leaf spring LS and the fastener FM, which are coupled to the first connector CP.

Since the inner surface of the first connector CP1 and the outer surface of the fifth joint J5 substantially match each other, the first connector CP1 may be able to slidably rotate in a state in which the fifth joint J5 is closely attached thereto without being detached therefrom. In addition, the leaf spring LS is closely fastened to the fifth joint J5, and thus a torque may occur during sliding rotation between the first connector CP1 and the fifth joint J5. Thus, when an external force which is over a predetermined value is applied, the first connector CP1 and the fifth joint J5 may perform sliding rotation without requiring an additional structure for generation of the torque.

In an exemplary embodiment, two recesses RC are included in an internal surface of the third joint J3, and the leaf spring LS is disposed in each recess RC of the third joint J3. The recess RC of the third joint J3 may be disposed to be offset from the recess RC of the fifth joint J5. That is, two recesses RC of the third joint J3 may be disposed between three recesses RC of the fifth joint J5 in the second direction y. The recess RC and the leaf spring LS of the third joint J3 may not overlap the recesses RC and the leaf springs LS of the fifth joint J5 in the first direction x. Accordingly, the leaf spring LS in the recess RC of the fifth joint J5 and the leaf spring LS in the recess RC of the third joint J3 may be disposed so as to not interfere with each other, and a coupling area of the fastener FM can be assured.

The coupling relationship between the first joint J1 and the fifth joint J5 may be similar to the coupling relationship between the fifth joint J5 and the first connector CP1. That is, the fastener FM is fixed to the fifth joint J5 through a hole of the leaf spring LS and the opening OP of the third joint J3, and the fifth joint J5 may rotate within a range that is limited by the opening OP with respect to the rotation axis that is parallel with the second direction y, together with the leaf spring LS and the fastener FM, which are coupled thereto. Since an inner side of the fifth joint J5 and an outer side of the third joint J3 substantially match each other, the fifth joint J5 can slidably rotate with respect to the rotation axis while being closely attached to the third joint J3. In addition, since the leaf spring LS is in close engagement with the third joint J3, torque can be generated during the sliding rotation between the fifth joint J5 and the third joint J3.

In another exemplary embodiment, the first joint J1 includes three recesses RC at an inner side thereof, and a leaf spring LS is provided in each recess RC of the first joint J1. The recesses RC of the first joint J1 may be displaced against the recesses RC of third joint J3. That is, the center recess RC of the first joint J1 may be disposed between two recesses RC of the third joint J3, and two other recesses RC may be disposed respectively at opposite sides thereof. The recesses RC of the first joint J1 and the leaf springs LS of the recesses RC thereof may not overlap the recesses RC and the leaf springs LS of the third joint J3 in the first direction x.

Accordingly, the leaf spring LS in the recess RC of the third joint J3 and the leaf spring LS in the recess RC of the third joint J1 may be disposed so as to not interfere with each other, and a coupling area of the fastener FM can be assured.

The coupling relationship between the first joint J1 and the third joint J3 may be similar to the coupling relationship between the third joint J3 and the fifth joint J5. That is, the fastener FM is fixed to the third joint J3 through a hole of the leaf spring LS and the opening OP of the first joint J1, and the third joint J3 may rotate within a range that is limited by the opening OP with respect to the rotation axis that is parallel with the second direction y, together with the leaf spring LS and the fastener FM, which are coupled thereto. Since an inner side of the third joint J3 and an outer side of the first joint J1 substantially match each other, the third joint J3 can slidably rotate with respect to the rotation axis while being closely attached to the first joint J1. In addition, since the leaf spring LS is in close engagement with the first joint J1, torque can be generated during the sliding rotation between the third joint J1 and the first joint J1.

Since the joints J1, J3, and J5 and the first connector CP1 of the hinge portion HU are connected in such a way, the hinge portion HU can rotate about at least one rotation axis parallel to the second direction y. The respective angles of rotation of the third joint J3, the fifth joint J5, and the first connector CP1 can be adjusted by adjusting lengths of the opening OP of each joint J1, J3, and J5, respectively. Since the hinge unit HU is composed of a small number of parts, the hinge unit HU can be simply and rigidly formed, and impact and folding reliability can be improved. In addition, since the inner and outer sides of each of the joints J1, J3, and J5 are in close contact with the curved surface, it may be bent with a small radius. In addition, since portions of the joints J1, J2, J3, J4, J5, and J6 contacting the display panel DP when the display device are curved and thus there are no corners, stress concentrated on a specific portion of the display panel DP can be prevented, and damage to the display panel DP can be reduced.

Although an exemplary embodiment that the first joint J1 and fifth joint J5 include three recesses and the third joint J3 include two recesses is illustrated in FIG. 7, the number of recesses included in each of the joints J1, J3, and J5 may vary in another exemplary embodiment.

Figure 10:
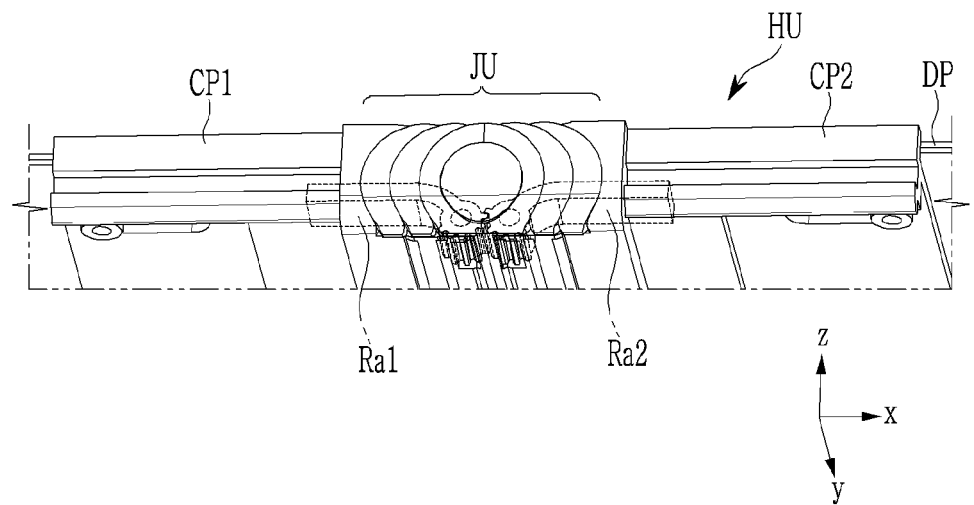
FIG. 10 is a perspective view of an exemplary embodiment of the hinge unit HU according to the invention.
Figure 11:
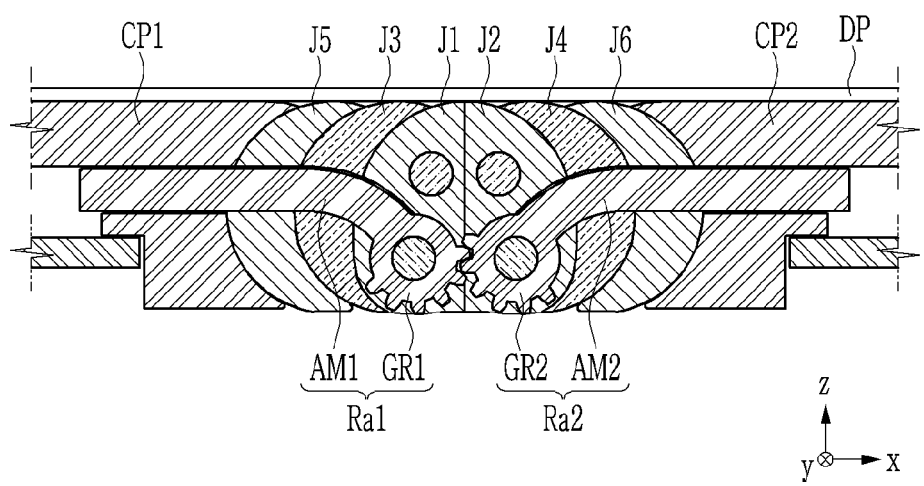
FIG. 11 is a cross-sectional view of an area where the rotation controllers are located while the hinge unit of FIG. 10 is in an unfolded state.
Figure 12:
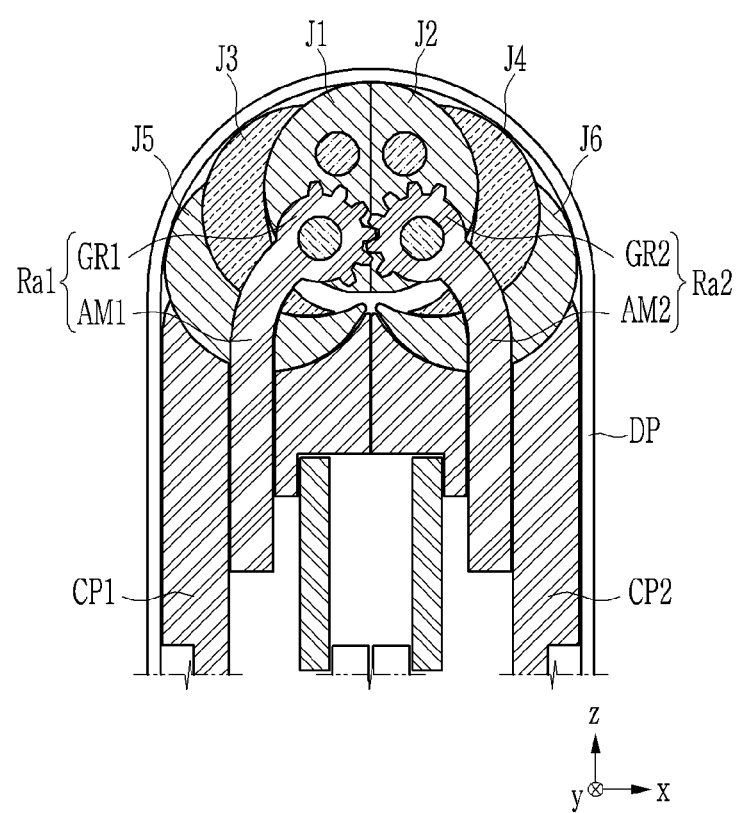
FIG. 12 is a cross-sectional view of an area where the rotation controllers are located while the hinge unit of FIG. 10 is in a folded state.

Referring to FIG. 10, FIG. 11, and FIG. 12, folding of the hinge unit HU will now be described.

FIG. 10 is a perspective view of an exemplary embodiment of the hinge unit HU according to the invention, FIG. 11 is a cross-sectional view of an area where the rotation controllers Ra1 and Ra2 are located while the hinge unit HU of FIG. 10 is in an unfolded state, and FIG. 12 is a cross-sectional view of an area where the rotation controllers Ra1 and Ra2 are located while the hinge unit HU of FIG. 10 is in a folded state. FIG. 10, FIG. 11, and FIG. 12 show a coupling relationship between portions of the joints J1, J2, J3, J4, J5, and J6 located at one side with reference to the center of the second direction y, the connectors CP1 and CP2, and the rotation controllers Ra1 and Ra2. A coupling relationship between portions of the joints J1, J2, J3, J4, J5, and J6 located at the other side with reference to the center of the second direction y, the connectors CP1 and CP2, and the rotation controllers Ra1 and Ra2 may be symmetrical to the coupling relationship shown in FIG. 10, FIG. 11, and FIG. 12 with respect to the center of the second direction y of the hinge unit HU.

Referring to FIG. 10, FIG. 11, and FIG. 12, the hinge unit HU includes a pair of rotation controllers Ra1 and Ra2 disposed at one side thereof. As shown in FIG. 6, the hinge unit HU may also include a pair of rotation controllers Rb1 and Rb2 at the other side thereof.

The first rotation controller Ra1 includes a first gear GR1 and a first arm AM1, and the second rotation controller Ra2 includes a second gear GR2 and a second arm AM2.

The first gear GR1 and the second gear GR2 may be disposed to be overlapped with the first joint J1 and the second joint J2, respectively, in the second direction y. Teeth of the first gear GR1 and teeth of the second gear GR2 are engaged with each other. The first gear GR1 and the second gear GR2 defines holes at their centers, respectively, and a protrusion or a shaft of the connecting member Ca is inserted into the holes of the first and second gears GR1 and GR2 such that the first gear GR1 and the second gear GR2 may rotate with respect to the center of each of the gears GR1 and GR2, respectively. Since the first gear GR1 and the second gear GR2 are engaged with each other, the second gear GR2 may also rotate when the first gear G1 rotates, or the first gear G1 may also rotate when the second gear GR2 rotates.

The first arm AM1 extended from the first gear GR1 penetrates through holes defined in the first joint J1, the third joint J3, and the fifth joint J5, respectively, and then is inserted into a hole of the first connector CP1. Likewise, the second arm AM2 extended from the second gear GR2 penetrates holes defined in the second joint J2, the fourth joint J4, and the sixth joint J6, respectively, and then is inserted into a hole of the second connector CP2. Thus, when the first arm AM1 rotates, the first joint J1, the third joint J3, the fifth joint J5, and the first connector CP1 may rotate together.

In addition, when the second arm AM2 rotates, the second joint J2, the fourth joint J4, the sixth joint J6, and the second connector CP2 may rotate together. Further, the hinge unit HU may be folded at an angle that corresponds to the rotation angles of the first gear GR1 and the second gear GR2.

In addition, when the display device is folded or unfolded, the first arm AM1 may slide in the hole of each of the first joint J1, the third joint J3, the fifth joint J5, and the first connector CP1, and the second arm AM2 may slide in the hole of each of the second joint J2, the fourth joint J4, the sixth joint J6, and the second connector CP2. The first arm AM1 and the second arm AM2 may include bent portions to enable such a sliding operation without damaging the joints J1, J2, J3, J4, J5, and J6 and the connectors CP1 and CP2.

Figure 13:
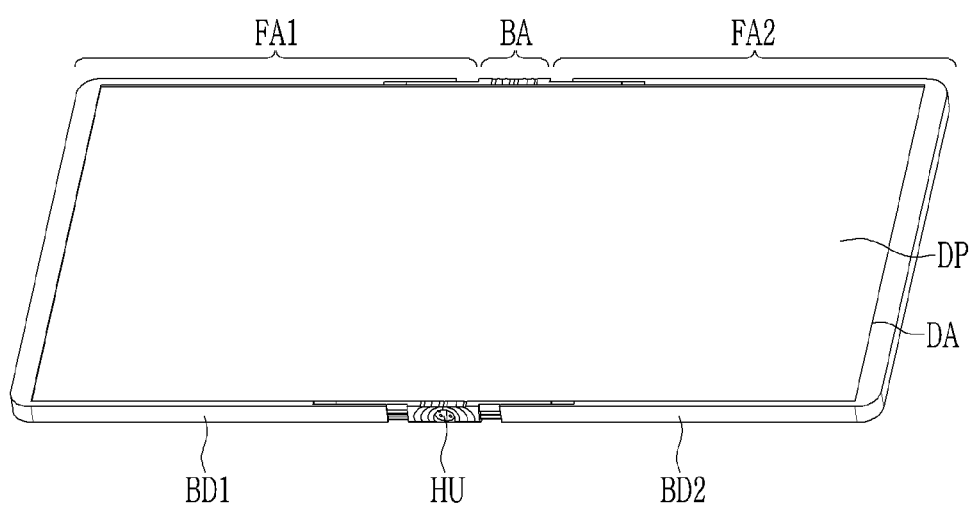
FIG. 13 is a perspective view of exemplary embodiment of a foldable display device according to the invention.
Figure 14:
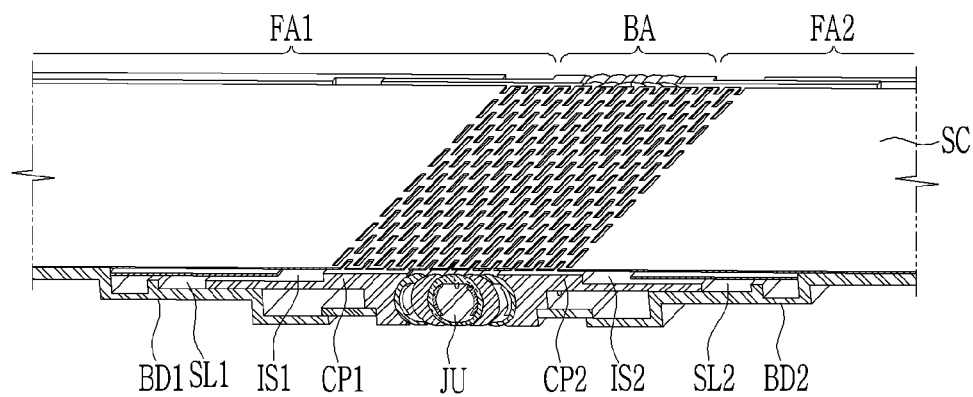
FIG. 14 is a partial perspective view of the foldable display device shown in FIG. 13 in an unfolded state.
Figure 15:
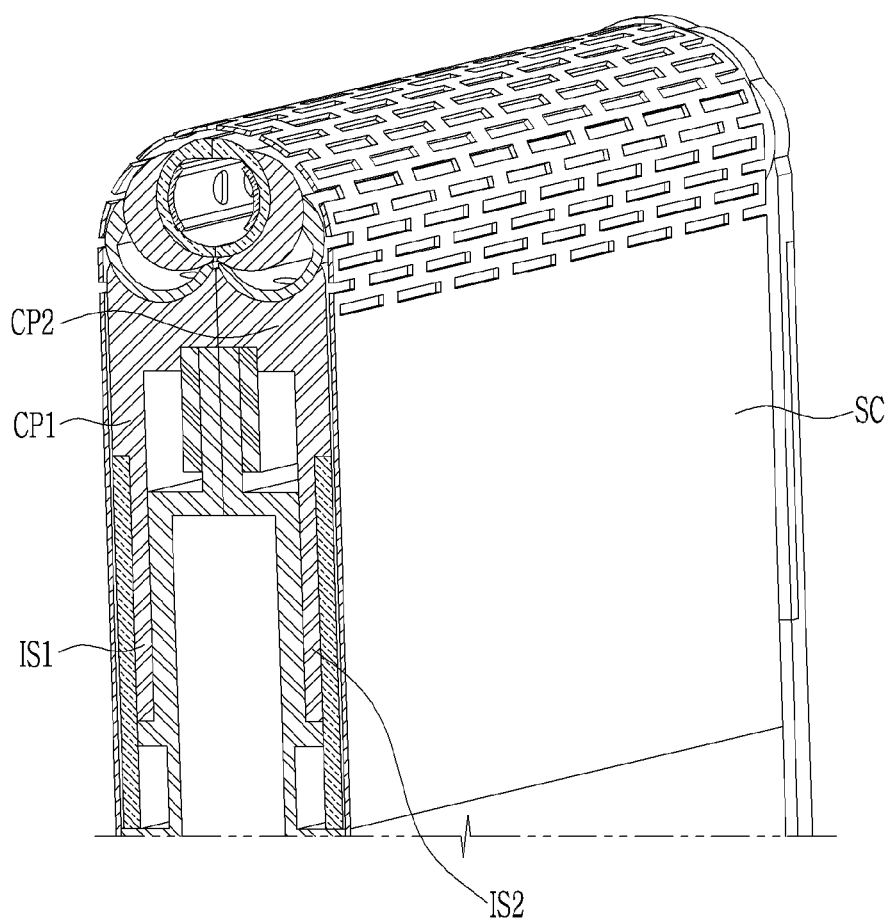
FIG. 15 is a partial perspective view of the foldable display device shown in FIG. 13 in a folded state.
Figure 16:
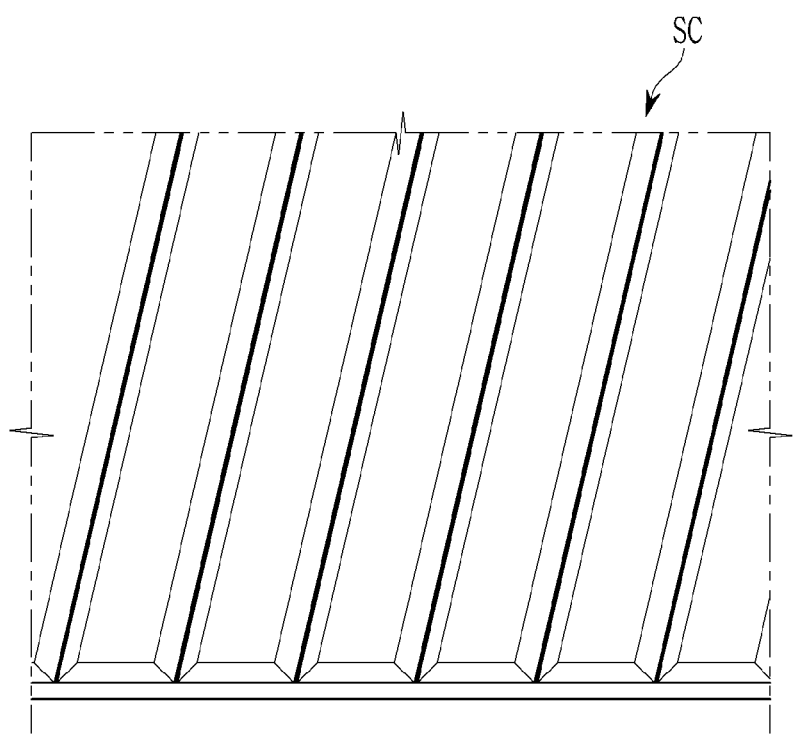
FIG. 16 is a partial perspective view of an exemplary embodiment of a step compensation portion according to the invention.

FIG. 13 is a perspective view of an exemplary embodiment of a foldable display device according to the invention, FIG. 14 is a partial perspective view of the foldable display device shown in FIG. 13 in an unfolded state, FIG. 15 is a partial perspective view of the foldable display device shown in FIG. 13 in a folded state, and FIG. 16 is a partial perspective view of an exemplary embodiment of a step compensation layer SC according to the invention. In FIG. 14 and FIG. 15, the display device partially cut is illustrate to clearly show the step compensation layer SC that is disposed below a display panel DP, and the display panel DP is not illustrated.

Referring to FIG. 13, FIG. 14, and FIG. 15, the display device includes bodies BD1 and BD2, and a step compensation layer SC disposed between a hinge unit HU and a display panel DP. The step compensation layer SC may be attached to the bodies BD1 and BD2 and the hinge unit HU.

When the display device is folded, the first and second connectors CP1 and CP2 of the hinge unit HU may be slid-inserted into slits SL1 and SL2 of the bodies BD1 and BD2 respectively to reduce a stress of the display panel DP. For the sliding-insertion, the connectors CP1 and CP2 may include insertion portions IS1 and IS2, respectively. When the display device is folded, the insertion portions IS1 and IS2 are completely inserted into the slits SL1 and SL2 of the bodies BD1 and BD2 such that a step is hardly generated between the hinge unit HU and the bodies BD1 and BD2. When the display device is unfolded, a step may be generated between the hinge unit HU and the bodies BD1 and BD2. The step compensation layer SC covers the step to provide the entirely flat surface, and may support the display panel DP to be flat. The step compensation layer SC may compensate a step which may be generated between joints J1, J2, J3, J4, J5, and J6 of a joint unit JU.

The step compensation layer SC may be a metal sheet formed of or including a metal or a metal alloy such as stainless steel, Invar, and the like. The step compensation layer SC may include a cut-out pattern where a plurality of openings is defined in a portion corresponding to a bendable area BA. Each opening of the cut-out pattern may be extended in a direction that is parallel with a bending axis (e.g., second direction y). The step compensation layer SC may be segmented in a stripe shape, as shown in FIG. 16, in a portion corresponding to the bendable area BA. The step compensation layer SC may be made of or include a polymer such as polyimide ("PI") or polyethylene terephthalate ("PET"), for example.

The display panel DP may be directly attached to the step compensation layer SC, or a functional layer such as an elastomer layer may be disposed between the display panel DP and the step compensation layer SC.

A structure of the display panel DP, which may be included in the display device, will now be described with reference to FIG. 17.

Figure 17:
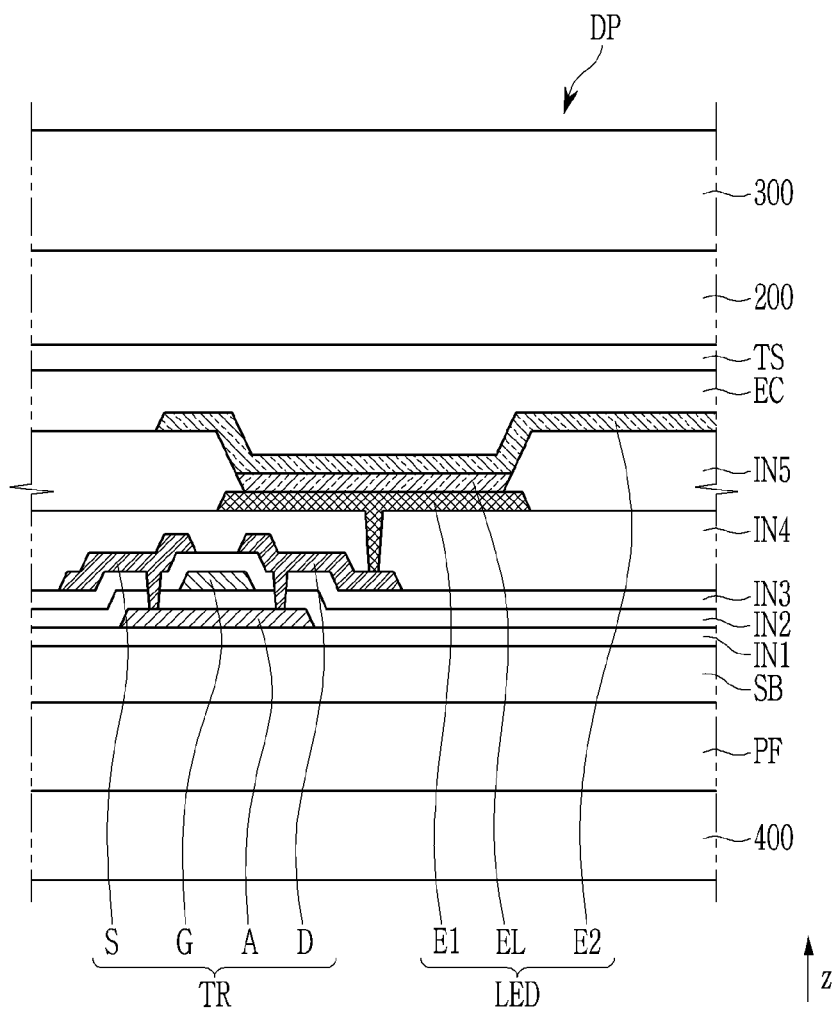
FIG. 17 is a cross-sectional view of exemplary embodiment of the display panel according to the invention.

FIG. 17 is a cross-sectional view of an exemplary embodiment of the display panel according to the invention. The cross-section shown in FIG. 17 may correspond to approximately one pixel area.

The display panel DP includes a substrate SB, a transistor TR disposed on the substrate SB, and a light emitting diode LED connected to the transistor TR.

The substrate SB may be a flexible substrate made of or including a polymer such as polyimide (PI), polyamide ("PA"), and polyethylene terephthalate (PET), for example. The substrate SB may include a barrier layer that prevents penetration of moisture, oxygen, and the like from the outside. The substrate SB may include at least one polymer layer and at least one barrier layer, and the polymer layer and the barrier layer may be alternately stacked.

A first insulation layer IN1 is disposed on the substrate SB. The first insulation layer IN1 may be called a buffer layer, and serves to block the impurity that can diffuse from the substrate SB to a semiconductor layer A in the process of forming the semiconductor layer A and to reduce the stress applied to the substrate SB. The barrier layer in the substrate SB and the first insulation layer IN1 may include an inorganic insulating material such as a silicon oxide or a silicon nitride. The semiconductor layer A of the transistor TR is disposed on the first insulation layer IN1, and the second insulation layer IN2 is disposed on the semiconductor layer A. The semiconductor layer A includes a source region, a drain region, and a channel region between the source region and the drain region. The semiconductor layer A may include a semiconductor material such as polysilicon, an oxide semiconductor, amorphous silicon, or the like. The second insulation layer IN2 may be called a gate insulation layer and may include an inorganic insulating material.

A gate conductor including a gate electrode G of the transistor TR is disposed on the second insulation layer IN2.

The gate conductor may include a metal or metal alloy such as one formed with molybdenum (Mo), copper (Cu), aluminum (Al), silver (Ag), chromium (Cr), tantalum (Ta), and titanium (Ti).

A third insulation layer IN3 is disposed on the gate conductor. The third insulation layer IN3 may be called an interlayer-insulation layer and may include an inorganic insulating material.

A data conductor including a source electrode S and a drain electrode D of the transistor TR is disposed on the third insulation layer IN3. The source electrode S and the drain electrode D are connected with the source region and the drain region of the semiconductor layer A through openings of the third insulation layer IN3 and the second insulation layer IN2, respectively. The data conductors may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy thereof.

A fourth insulation layer IN4 is disposed on the data conductor. The fourth insulation layer IN4 may be called a planarization layer and may include an organic insulating material.

A first electrode E1 is disposed on the fourth insulation layer IN4. The first electrode E1 may be also called a pixel electrode. The first electrode E1 may be connected with the drain electrode D through an opening of the fourth insulation layer IN4 to receive a data voltage that controls luminance of the light emitting diode LED.

A fifth insulation layer IN5 is disposed on the fourth insulation layer IN4. The fifth insulation layer IN5 may be called a pixel defining layer and defines an opening overlapping the first electrode E1. The emission layer EL is disposed on the first electrode E1 in the opening of the fifth insulation layer IN5, and the second electrode E2 is disposed on an emission layer EL. The second electrode E2 may also be called a common electrode.

The first electrode E1, the emission layer EL, and the second electrode E2 together form the light emitting diode LED. The light emitting diode LED may be an organic light emitting diode, for example. The first electrode E1 and second electrode E2 may be an anode and a cathode of the light emitting diode LED, respectively.

An encapsulation layer EC is disposed on the second electrode E2. The encapsulation layer EC may encapsulate the light emitting diode LED to prevent moisture or oxygen from penetrating from the outside. The encapsulation layer EC may include at least one inorganic material layer and at least one organic material layer, and the inorganic material layer and the organic material layer may be alternately stacked.

A touch sensor layer TS may be disposed on the encapsulation layer EC. The touch sensor layer TS may include touch electrodes formed of or including a transparent conductive material such as ITO or IZO, a metal mesh, and the like, and the touch electrodes may be formed of a single layer or a plurality of layers. The touch sensor layer TS may be disposed directly on the encapsulation layer EC, or may be separately formed and attached to the encapsulation layer EC.

An anti-reflection layer 200 may be disposed on the touch sensor layer TS to reduce reflection of external light. The antireflection layer 200 may include a polarization layer. Instead of separately forming the anti-reflection layer 200, the encapsulation layer EC or the touch sensor layer TS may be formed in a refractive index matching structure to obtain an anti-reflection effect.

A cover window 300 may be disposed on the anti-reflection layer 200 to protect the whole upper surface of the display panel DP. The cover window 300 is a flexible window that is optically transparent, and at least a portion thereof can be bent. The cover window 300 may be flexible and bendable in an area corresponding to at least a bendable area BA of the display device, or may be entirely flexible. The cover window 300 may be a polymer film made of a polymer such as polyimide (PI), polyethylene terephthalate (PET), and polyurethane ("PU") for a flexible characteristic, for example. The cover window 300 may be a glass film in which a region corresponding to the bendable area BA of the display device is locally thin (e.g., less than 100 micrometers (μm) in thickness). The cover window 300 may be attached to the anti-reflection layer 200 by an adhesive such as an optically clear adhesive ("OCA") or a pressure-sensitive adhesive ("PSA").

A protective layer PF may be disposed below the substrate SB to protect the display panel DP, and a functional layer 400 may be disposed below the protective layer PF. The functional layer 400 may include a functional sheet such as a cushion layer, a heat dissipation sheet, a light shielding sheet, and a waterproof tape.

Although the display panel DP is described as an example of a light emitting display panel, the display panel DP may be various display panels such as a display panel including a liquid crystal layer.

While the inventive concept has been described in connection with what is presently considered to be practical exemplary embodiments, it is to be understood that the inventive concept is not limited to the disclosed exemplary embodiments. On the contrary, it is intended to cover various modifications and equivalent arrangements included within the spirit and scope of the appended claims.

What is claimed is:

1. A foldable display device comprising:
    a first body and a second body; and
    a hinge unit which is connected between the first body and the second body,
    wherein the hinge unit comprises
        a first joint which includes a first recess,
        a second joint which faces the first joint,
        a third joint disposed at one side of the first joint,
        a first leaf spring disposed in the first recess, and
        a first fastener fixed to the third joint through the first leaf spring and the first joint.

2. The foldable display device of claim 1, wherein an outer side of the first joint and an inner side of the third joint face each other, the outer side of the first joint and the inner side of the third joint are curved, and the outer side of the first joint is the one side of the first joint.

3. The foldable display device of claim 1, wherein the first joint has a first opening defined in the first recess,
    the first fastener comprises a portion disposed in the first opening, and
    a length of the first opening is larger than a diameter of the portion of the first fastener disposed in the first opening.

4. The foldable display device of claim 1, wherein the third joint is slidably coupled to the first joint.

5. The foldable display device of claim 1, wherein, in an unfolded state of the foldable display device, the first joint, the second joint, and the third joint are aligned in a first direction, and
    the first joint, the second joint, and the third joint respectively extend in a second direction that crosses the first direction.

6. The foldable display device of claim 5, wherein the third joint comprises a third recess, and
    the first recess and the third recess do not overlap each other in the first direction.

7. The foldable display device of claim 6, wherein the hinge unit further comprises:
    a fourth joint disposed at one side of the second joint;
    a fifth joint disposed at one side of the third joint;
    a third leaf spring disposed in the third recess; and
    a third fastener fixed to the fifth joint through the third leaf spring and the third joint.

8. The foldable display device of claim 7, wherein an outer side of the third joint and an inner side of the fifth joint face each other,
    the outer side of the third joint and the inner side of the fifth joint are curved, and the outer side of the third joint is the one side of the third joint.

9. The foldable display device of claim 7, wherein the first leaf spring and the third leaf spring do not overlap in the first direction.

10. The foldable display device of claim 7, wherein the hinge unit further comprises:
    a first connector disposed at one side of the fifth joint;
    a fifth leaf spring disposed in a fifth recess of the fifth joint; and
    a fifth fastener fixed to the first connector through the fifth leaf spring and the fifth joint.

11. The foldable display device of claim 10, wherein the third leaf spring and the fifth leaf spring do not overlap in the first direction.

12. The foldable display device of claim 10, wherein the hinge unit further comprises:
    a first rotation controller which includes a first gear and a first arm; and
    a second rotation controller which includes a second gear and a second arm,
    wherein teeth of the first gear and teeth of the second gear are engaged with each other, and
    the first arm is inserted into a hole of the first connector through holes of the first joint, the third joint, and the fifth joint.

13. The foldable display device of claim 12, wherein the first gear and the second gear are overlapped with the first joint and the second joint respectively in the second direction.

14. The foldable display device of claim 1, wherein each of the first joint and the second joint comprises a spindle and a head, the head being disposed at one side of the spindle and defining a hole,
    the hinge unit further comprises a connecting member including at least two protrusions, and
    the protrusions of the connecting member are inserted into corresponding holes of the head of the first joint and the head of the second joint such that the first joint and the second joint are coupled to each other.

15. The foldable display device of claim 1, further comprising a display panel disposed on the first body, the second body, and the hinge unit,
    wherein the hinge unit supports the display panel to be bendable.

16. The foldable display device of claim 15, further comprising a step compensation layer which is disposed between the first body, the second body, the hinge unit, and the display panel, wherein the step compensation layer comprises a cut-out pattern or is segmented in an area that overlaps the hinge unit.

* * * * *